(12) United States Patent
Natzle et al.

(10) Patent No.: US 7,470,629 B2
(45) Date of Patent: Dec. 30, 2008

(54) STRUCTURE AND METHOD TO FABRICATE FINFET DEVICES

(75) Inventors: Wesley Natzle, New Paltz, NY (US); Bruce B. Doris, Brewster, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 11/259,483

(22) Filed: Oct. 26, 2005

(65) Prior Publication Data

US 2006/0043502 A1 Mar. 2, 2006

(51) Int. Cl.
*H01L 21/302* (2006.01)
*H01L 21/461* (2006.01)

(52) U.S. Cl. .................. 438/713; 438/151; 438/164; 438/295; 257/623; 257/E21.409

(58) Field of Classification Search ................ 438/151, 438/164, 295, 713; 257/623, E21.409
See application file for complete search history.

(56) References Cited

U.S. PATENT DOCUMENTS

| | | | | |
|---|---|---|---|---|
| 5,282,925 | A * | 2/1994 | Jeng et al. | 216/59 |
| 5,682,055 | A * | 10/1997 | Huang et al. | 257/408 |
| 5,766,971 | A * | 6/1998 | Ahlgren et al. | 438/296 |
| 6,475,869 | B1 * | 11/2002 | Yu | 438/303 |
| 6,770,516 | B2 * | 8/2004 | Wu et al. | 438/154 |
| 6,855,588 | B1 * | 2/2005 | Liao et al. | 438/197 |
| 6,911,383 | B2 | 6/2005 | Doris et al. | |
| 6,977,194 | B2 | 12/2005 | Belyansky et al. | |
| 7,049,662 | B2 | 5/2006 | Natzle et al. | |
| 2004/0262688 | A1 * | 12/2004 | Nowak et al. | 257/350 |
| 2005/0093074 | A1 * | 5/2005 | Anderson et al. | 257/365 |
| 2005/0110085 | A1 | 5/2005 | Zhu et al. | |
| 2005/0127362 | A1 | 6/2005 | Zhang et al. | |
| 2005/0139860 | A1 * | 6/2005 | Snyder et al. | 257/155 |
| 2005/0145954 | A1 | 7/2005 | Zhu et al. | |
| 2005/0233565 | A1 | 10/2005 | Zhu et al. | |
| 2005/0239242 | A1 | 10/2005 | Zhu et al. | |
| 2005/0245017 | A1 | 11/2005 | Belyansky et al. | |
| 2005/0263831 | A1 | 12/2005 | Doris et al. | |
| 2005/0280121 | A1 | 12/2005 | Doris et al. | |
| 2005/0282325 | A1 | 12/2005 | Belyansky et al. | |

(Continued)

*Primary Examiner*—George Fourson
*Assistant Examiner*—John M Parker
(74) *Attorney, Agent, or Firm*—Ohlandt, Greeley, Ruggiero & Perle, L.L.P.; Steven Capella, Esq.

(57) ABSTRACT

There is provided a method for fabricating a FinFET in which a self-limiting reaction is employed to produce a unique and useful structure that may be detectable with simple failure analysis techniques. The structure is an improved vertical fin with a gently sloping base portion that is sufficient to reduce or prevent the formation of an undercut area in the base of the vertical fin. The structure is formed via the self-limiting properties of the reaction so that the products of the reaction form both vertically on a surface of the vertical fin and horizontally on a surface of an insulating layer (e.g., buried oxide). The products preferentially accumulate faster at the base of the vertical fin where the products from both the horizontal and vertical surfaces overlap. This accumulation or build-up results from a volume expansion stemming from the reaction. The faster accumulation in the corner areas near the base, limits the reaction first in the base region, thereby etching less material and forming the remaining, un-etched material into the sloping dielectric base.

15 Claims, 8 Drawing Sheets

U.S. PATENT DOCUMENTS

| | | |
|---|---|---|
| 2006/0003554 A1 | 1/2006 | Zhu et al. |
| 2006/0014338 A1 | 1/2006 | Doris et al. |
| 2006/0043421 A1 | 3/2006 | Doris et al. |
| 2006/0043502 A1 | 3/2006 | Natzle et al. |
| 2006/0057787 A1 | 3/2006 | Doris et al. |
| 2006/0091450 A1 | 5/2006 | Zhu et al. |

* cited by examiner

STRUCTURE AND METHOD TO FABRICATE FINFET DEVICES

BACKGROUND OF THE INVENTION

1. Field of the Invention

The present invention relates to semiconductor manufacturing. More particularly, the present invention relates to the manufacture of field effect transistors (FETs) having vertical fins (FinFETs).

2. Description of the Prior Art

A FinFET is known in the art to be the simplest double gate structure to manufacture. Hence, the FinFET is a promising candidate to achieve ultimate device scaling.

In a FinFET, a vertical fin is defined to form the body of a transistor. Gates can be formed on one or both sides of the vertical fin. When both sides of the vertical fin have a gate formed thereon, the transistor is generally referred to as a double-gate FinFET. A double-gate FinFET helps suppress short channel effects (SCE), reduce leakage, and enhance switching behavior. Also, a double-gate FinFET can increase gate area, which can in turn improve current control, without increasing gate length.

Current FinFET process technology suffers from certain drawbacks. One significant drawback stems from the sacrificial oxidation and pre-gate oxide clean processes. These processes are used to remove/heal the significant damage that results from the techniques or processes used to form the vertical fin of the FinFET. The sacrificial oxidation is typically used to heal etching damage and the pre-gate oxide clean is used to remove sacrificial oxidation. These processes may also be used to prepare a surface channel for a gate oxidation process.

FIGS. 1a through 1f illustrate an example method of forming a FinFET in the prior art. As shown in FIG. 1a, a semiconductor substrate such as, for example, a silicon-on-insulator (SOI) substrate 100 can have a first semiconductor layer 102, an overlying insulating layer 104, and an overlying second semiconductor layer 106. As shown in FIG. 1b, an overlying hard mask 108 may be provided with a patterned photoresist layer 110 thereon. As shown in FIG. 1c, the photoresist layer 110 may be trimmed or patterned using a hard mask etching. As shown in FIG. 1d, in combination, the photoresist layer 110 and the second semiconductor layer 106 may be selectively etched using the hard mask 108, for example, to form a vertical fin structure from the second semiconductor layer 106. As shown in FIG. 1e, an oxide, 112 formed by a sacrificial oxidation process may be used to heal any etching damage. As shown in FIG. 1f, a pre-gate oxide clean may be used to remove the sacrificial oxidation. Over-etching may be required to ensure that all of the sacrificial oxide is removed.

As a consequence of the etching processes, undercuts 114 may be formed at the base of the vertical fin structure. Hence, substantially thin fins, which are commonly used for gate-length scaling, can be undercut to such an extent that the integrity of the fin becomes compromised and the fin can be susceptible to collapse. Whereas, with ticker fins, the undercut can trap gate electrode material, which can cause gate shorts when several gates share the same fin.

The present invention is directed to an improved structure and method for fabricating FinFET devices that overcomes at least the above noted drawback.

SUMMARY OF THE INVENTION

It is an object of the present invention to provide a method for fabricating a FinFET with at least one high quality surface channel.

It is another object of the present invention to provide a method for fabricating a FinFET that minimizes or eliminates the negative effects of over-etching.

It is still another object of the present invention to provide a method for fabricating a FinFET that uses a self-limiting reaction to minimize or eliminate the negative effects of over-etching.

It is yet another object of the present invention to provide a FinFET structure with a vertical fin surrounded by dielectric material with an outwardly sloping base to prevent any undercutting of the vertical fin.

It is a further object of the present invention to provide a method for fabricating a FinFET with no undercut using a hard mask.

It is still a further object of the present invention to provide a method for fabricating a FinFET with fins formed by conventional image transfer (CIT) or side wall image transfer (SIT).

These and other objects and advantages of the present invention are achieved by a method for fabricating a FinFET in which a self-limiting reaction is employed to produce a unique and useful structure that may be detected with a simple failure analysis technique. The structure is an improved vertical fin with a gently sloping dielectric base portion that is sufficient to prevent the formation of an undercut in the base of the vertical fin. The structure is formed via the self-limiting properties of the reaction so that the products of the reaction form both vertically on a surface of the vertical fin and horizontally on a surface of an insulating layer. The products preferentially accumulate faster at the base of the vertical fin where the products from both the horizontal and vertical surfaces overlap. This accumulation or build-up results from a volume expansion stemming from the reaction. The faster accumulation in the corner areas near the base, limits the reaction first in the base region, thereby etching less material and forming the remaining, un-etched material into the sloping dielectric base.

DETAILED DESCRIPTION OF THE INVENTION

Figure 1A:
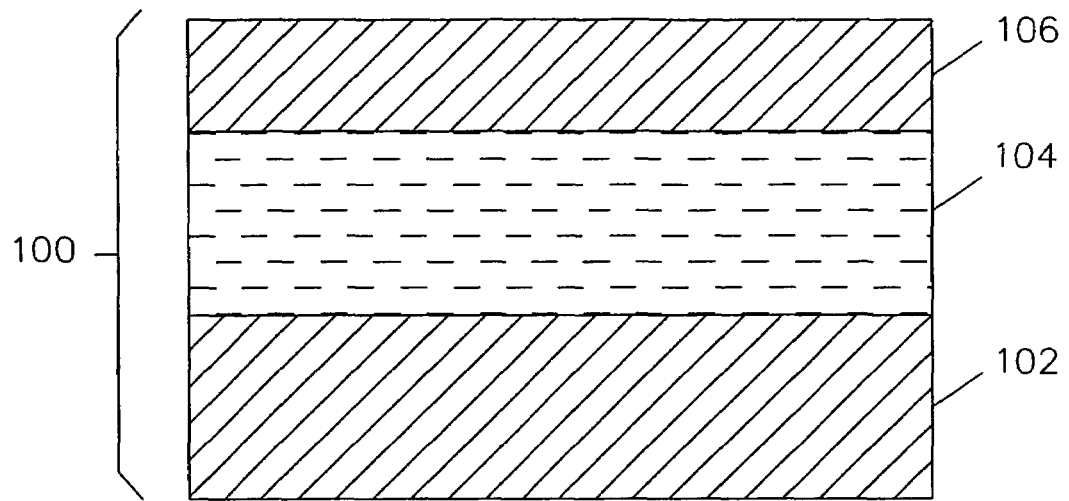
FIGS. 1a through 1f are cross-sectional side views of a FinFET during a fabrication method in the prior art.
Figure 1B:
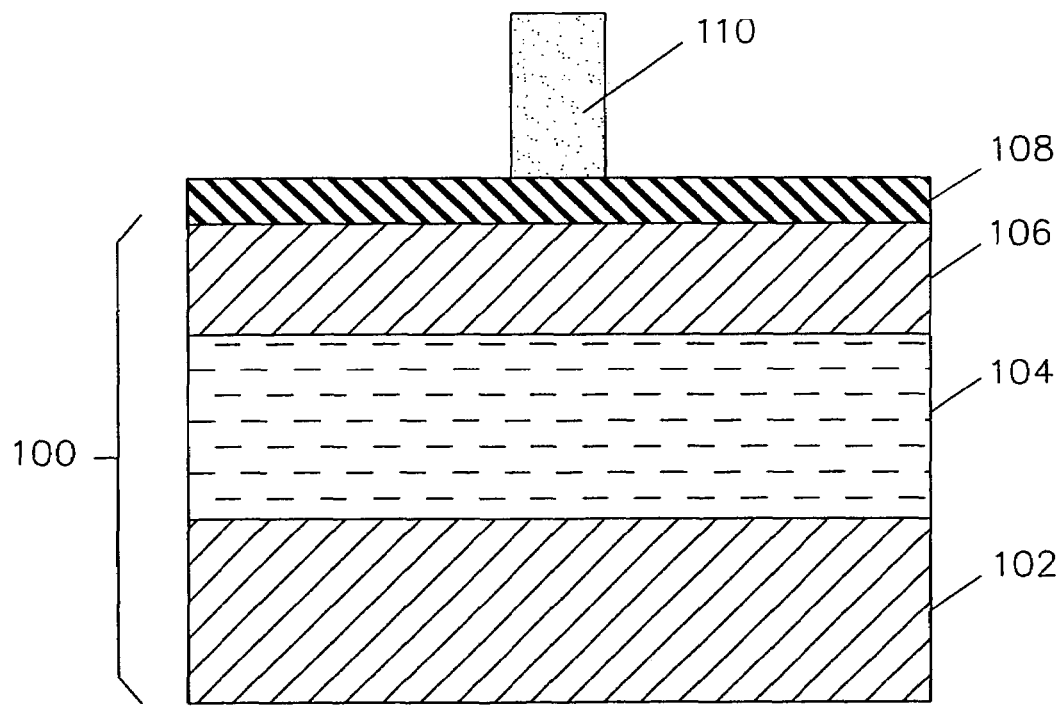
Figure 1C:
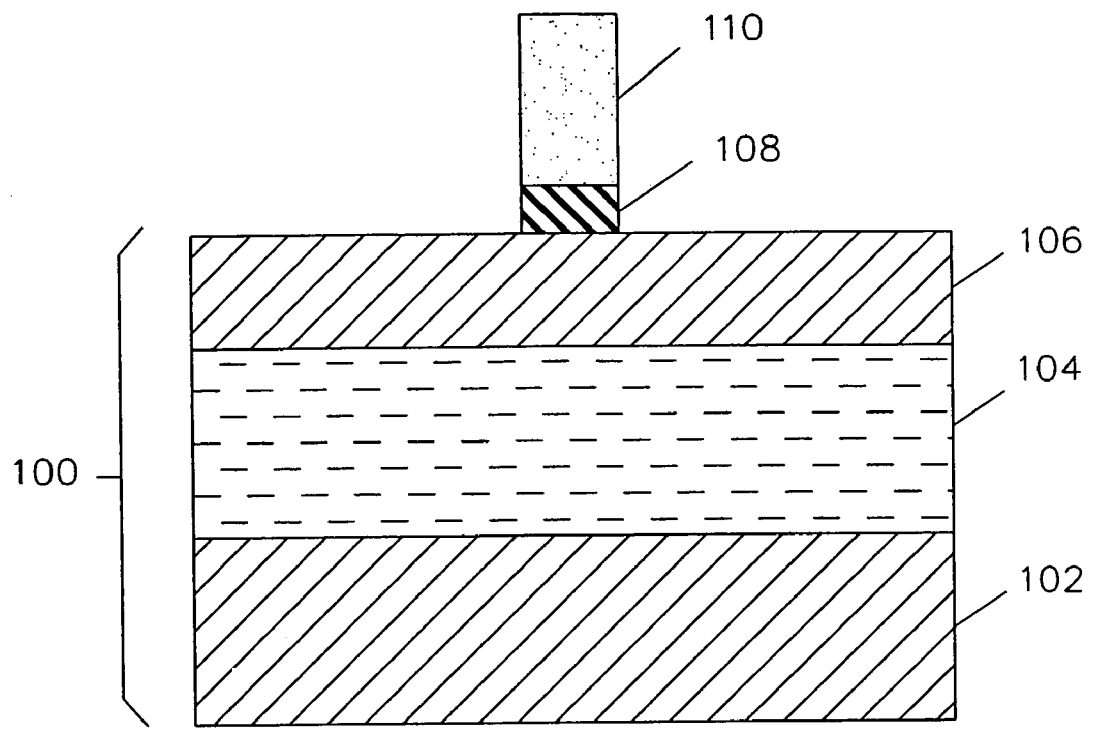
Figure 1D:
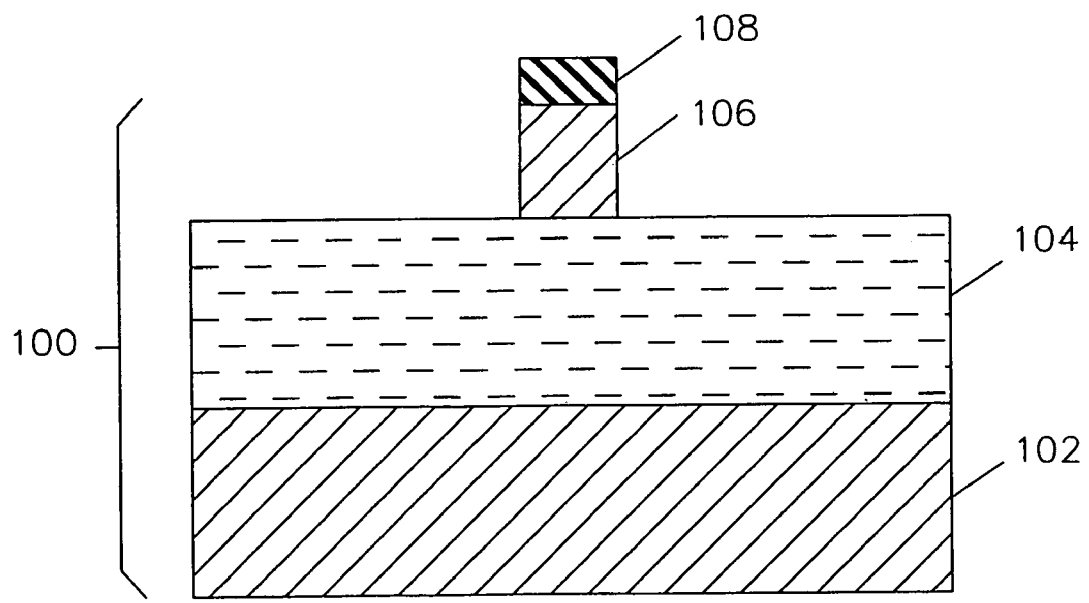
Figure 1E:
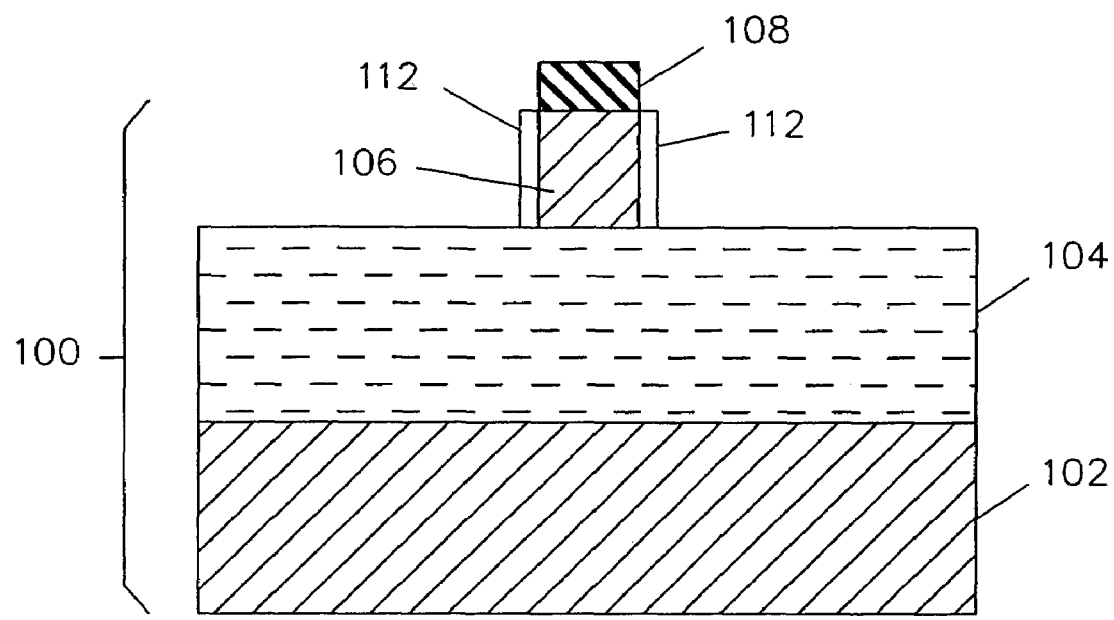

The present invention may be readily configured to any of a variety of device designs and/or methods for forming the same. Further, it will be understood by one of ordinary skill in the art that the present invention is not limited to the specific structures shown in the drawings, as the shown structures are for purposes of illustration only. It will also be understood by one of ordinary skill in the art that the present invention is not limited to the specific fabrication steps detailed herein. For example, it is not necessary to use a hard mask to define the fin.

Figure 2:
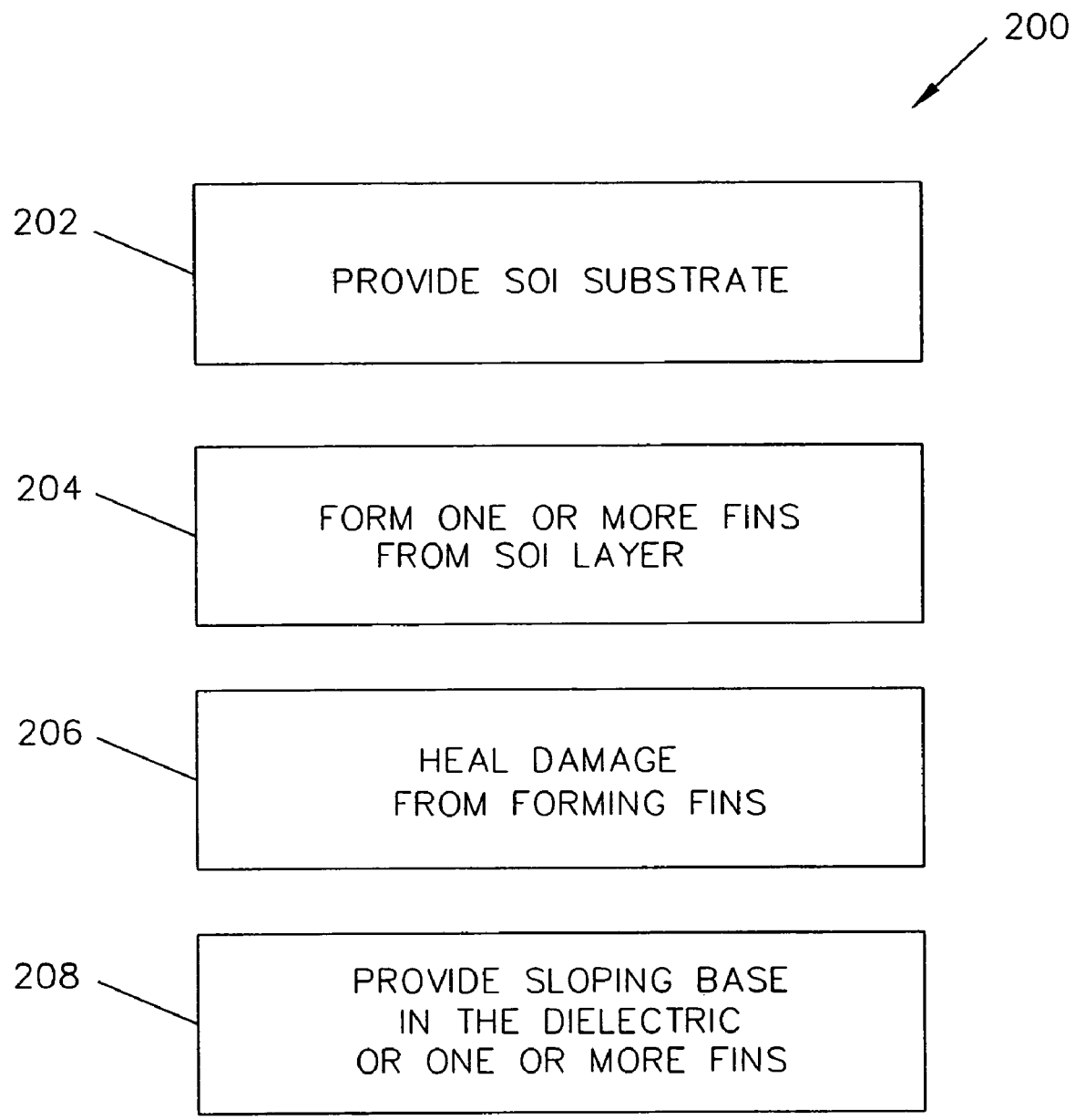
FIG. 2 is a flow diagram illustrating a fabrication method in accordance with an illustrative embodiment of the present invention.

Referring now to the drawings and, in particular, to FIG. 2, a method for forming a FinFET in accordance with an illustrative embodiment of the present invention is shown and generally represented by reference numeral 200. Method 200 may form a FinFET with any number and/or combination of other structures by: providing an appropriate substrate, such as, for example, an SOI substrate; forming one or more vertical fins from a layer, such as, for example, an SOI layer; healing damage resulting from vertical fin formation; and providing a sloping base to the dielectric, for example, or one or more vertical fins. Each step employed to form the one or more FinFETs may also be employed to form portions of other devices on the same substrate.

Figure 3A:
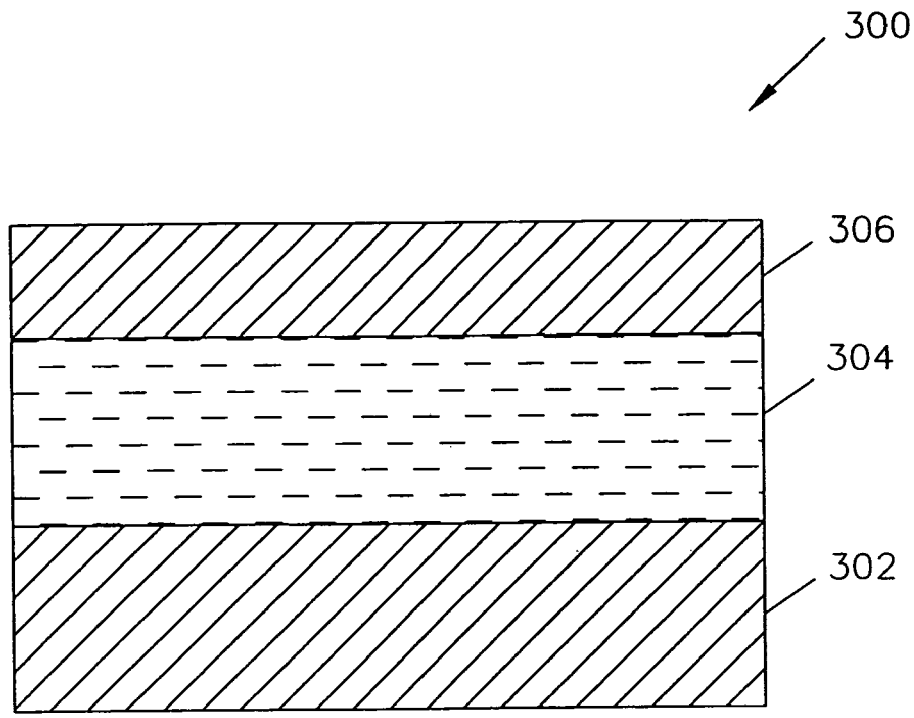
FIGS. 3a through 3f are cross-sectional side views of a FinFET during a fabrication method in accordance with an exemplary embodiment of the present invention.

As shown, first step 202 of method 200 is to provide an appropriate substrate, such as, for example, a substrate 300 shown in FIG. 3a. Referring to FIG. 3a, substrate 300 can have a first semiconductor layer 302 that underlies a buried insulator 304 that underlies a second semiconductor layer 306. Thus, substrate 300 can, for example, have a single crystal SOI wafer. It is noted, however, that other substrate 300 embodiments, such as, for example, a non-SOI wafer, may also be used.

Although first semiconductor layer 302 is only shown, other semiconductor layers of varying complexity may be advantageously used as appropriate for the stated objectives of the present invention. First semiconductor layer 302 can be made of any appropriate semiconductor material including, but not limited to: Si, Ge, GaP, InAs, InP, SiGe, GaAs, or other III/V compounds. For illustrative purposes of the present invention, first semiconductor layer 302 can be a single crystal silicon.

Insulator 304 preferably can be formed on first semiconductor layer 302 using any of a variety of techniques known in the art. For example, a separation by implantation and oxidation (SIMOX) technique or wafer bonding and etch-back technique may be used. Insulator 304 can have any insulative material, such as, for example, buried oxide (BOX). However, any other type and/or combination of buried insulator material may also be used for insulator 304.

Second semiconductor layer 306 may be formed on insulator 304 by any technique known in the art. Second semiconductor layer 306 may, similar to first semiconductor layer 304, be made of any semiconductor material (e.g., Si, Ge, GaP, InAs, InP, SiGe, GaAs, or other III/V compounds). For illustrative purposes of the present invention, second semiconductor layer 306 is preferably a single-crystal (SOI) layer. Second semiconductor layer 306 can have any height or thickness. As clarified hereafter, the height of second semiconductor layer 306 can define the height of the one or more vertical fins.

Figure 3B:
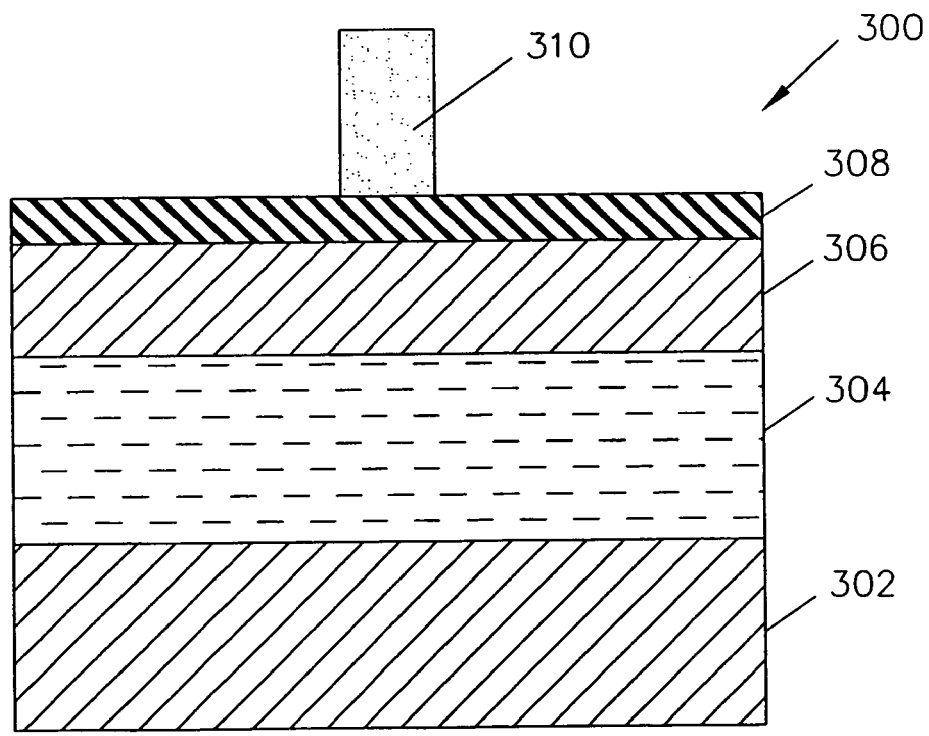

Referring to FIG. 3b, step 204 of method 200 is to form one or more vertical fins from second semiconductor layer 306, for example. The one or more vertical fins may be formed by any technique known in the art. For example, as shown, a hard mask film 308 may be deposited on second semiconductor layer 306 to preferably act as an etch stop layer that can be used, as needed, throughout the vertical fin fabrication process. For illustrative purposes of the present invention, hard mask film 308 preferably may be silicon dioxide ($SiO_2$) or silicon nitride ($Si_3N_4$).

In addition, a photoresist layer 310 may be provided above hard mask film 308, as shown. In at least one embodiment of the present invention, hard mask film 308 can be patterned or etched by any technique known in the art. For example, step 204 may be accomplished by patterning and/or etching using a conventional image transfer (CIT) or a sidewall image transfer (SIT) to generate any pattern or patterns of narrow and/or broad lines on photoresist layer 310 as desired. Other techniques or processes may also be used in order to provide greater design flexibility with respect to forming narrow and/or broad vertical fins.

Figure 3C:
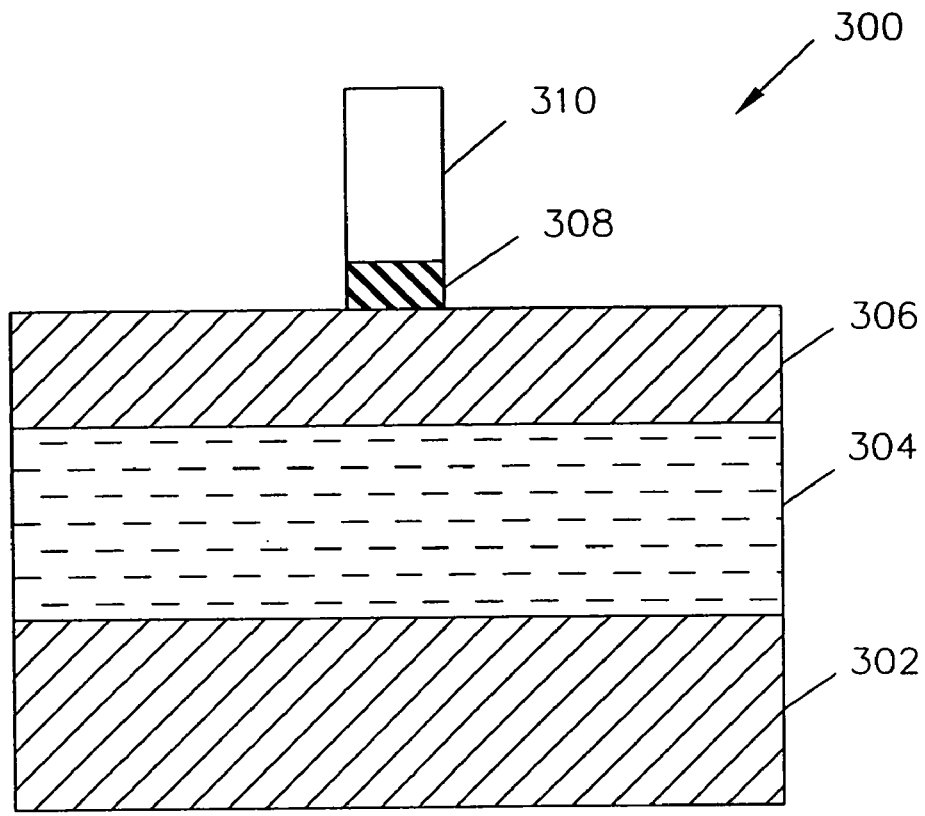
Figure 3D:
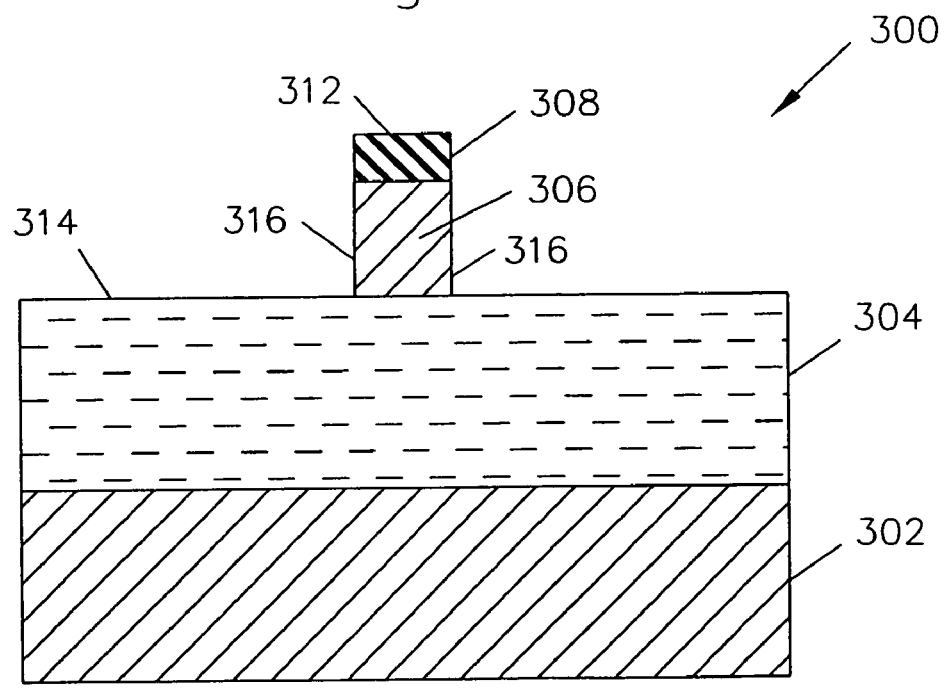

Referring to FIGS. 3c and 3d, for illustrative purposes of the present invention, after hard mask film 308 has been patterned or etched as desired (FIG. 3c); photoresist layer 310 and/or second semiconductor layer 306 may be, for example, removed and/or stripped away by a suitable chemical process. This may result in hard mask film 308 and/or second semiconductor layer 306 shown in FIG. 3d. Thus, the one or more narrow and/or broad vertical fins preferably remain.

Preferably, these one or more vertical fins consist of portions of second semiconductor layer 306 with respective hard mask film 308 adjacent each of the one or more vertical fins top surface 312. The top surface 312 is preferably substantially horizontal to, or parallel with, a substantially horizontal surface 314 of insulator 304. Each vertical fin preferably also has opposing vertical sidewalls or surfaces 316 that are substantially perpendicular to horizontal surface 314 of insulator 304.

It is noted that irrespective of the technique used to form the one or more vertical fins, any or all of the one or more vertical fins may be doped as appropriate to form P-well structures and N-well structures in the case of NFETs and PFETs, for example.

Figure 3E:
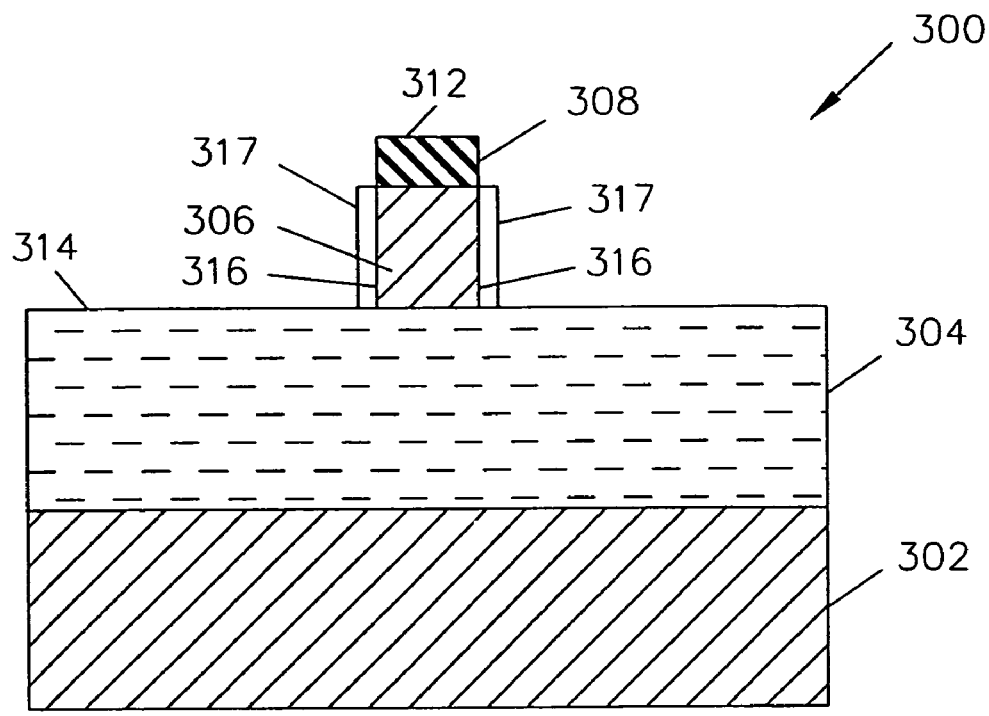

Referring now to FIG. 3e, step 206 of method 200 is to heal damage resulting from the patterning and/or etching process of the previous steps. The healing process may be accomplished by any technique known in the art. For example, a sacrificial oxidation can form the structure shown in FIG. 3e, including oxide layer 317. Then a pre-gate oxide clean may be used, and more particularly, a 60A thermal oxidation may be used along with a non-damaging oxide etch with a 90A thermal oxide etch target. This over-etching is preferably used to ensure that all of the sacrificial oxide is at least substantially removed from substrate 300.

Figure 1F:
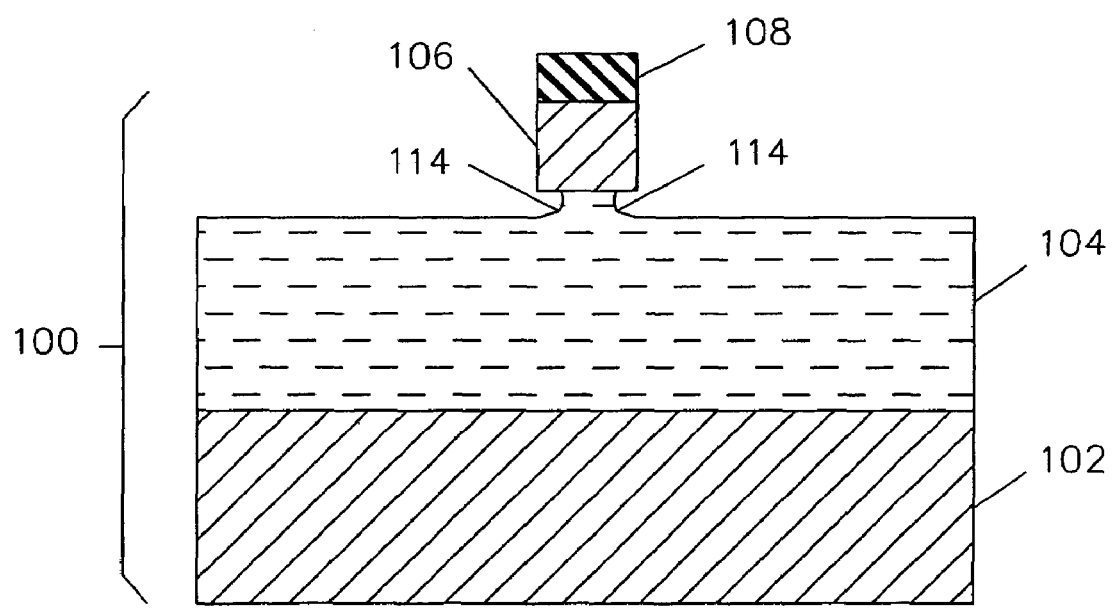
Figure 3F:
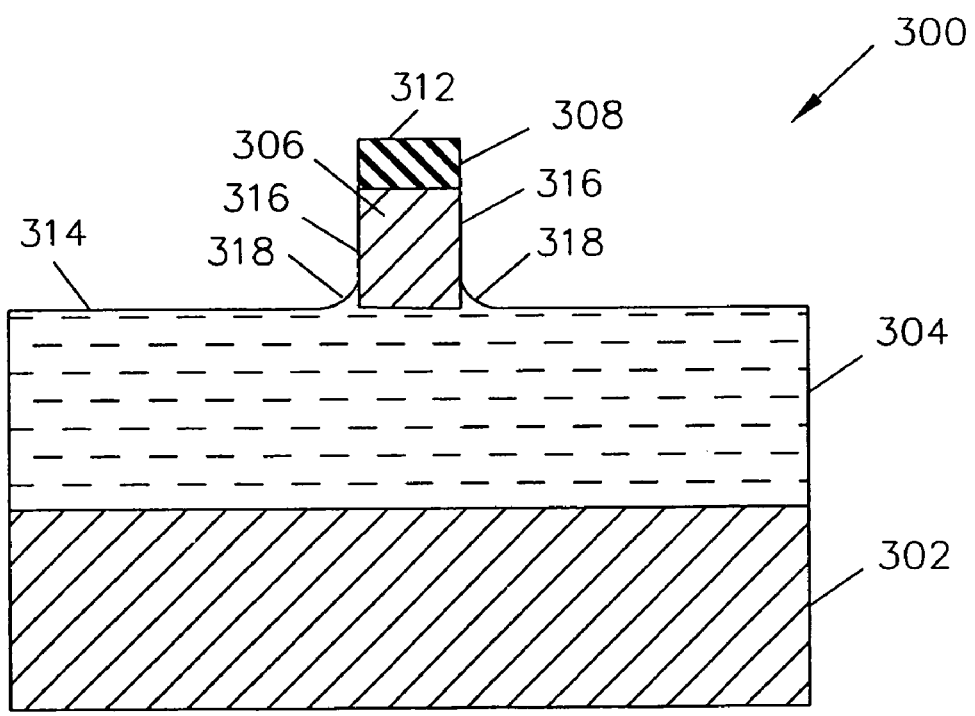

Referring to FIG. 3f, step 208 of method 200 is to form or provide a preferably gently or smoothly sloped base structure 318. Preferably, base structure 318 may be detected with simple failure analysis techniques. Base structure 318 may preferably be part of each vertical fin as well as a part of insulator 304. Base structure 318 preferably improves the integrity of each vertical fin by substantially inhibiting, and preferably preventing, damage to the one or more vertical fins stemming from the etching or patterning associated with the previously discussed steps. For example, base structure 318 preferably prevents the formation of any undercuts such as shown in FIG. 1f.

For illustrative purposes of the present invention, step 208 may be accomplished, in combination with at least a portion of step 206, by a self-limiting reaction as described below. For example, gaseous HF and $NH_3$ may be reacted with an oxide, or certain nitrides, preferably at room temperature and in a vacuum, or chamber, to form ammonium hexafluorosilicate, $(NH_4)_2SiF_6$, which remains on a surface of $SiO_2$, for example, to inhibit or impede the reaction of the HF with the oxide. The ammonium hexafluorosilicate reaction byproduct layer effectively inhibits diffusion of HF to the oxide when it builds up to a self limiting thickness. Preferably, after the reaction is stopped, the reaction by-product can be removed by a thermal desorption preferably at a temperature greater than 100° C., and/or by dissolution in $H_2O$. It is noted that the extent of $SiO_2$ removal may be controlled by varying the temperature and/or pressure to produce a thinner or thicker reaction by-product layer or by repeated sequencing of thermal desorption and reaction steps. In particular, self-limiting thickness of the reaction by-product layer is selected by using the value of temperature or pressure.

Thus, in accordance with a preferred embodiment of the present invention, as the reaction by-product forms on vertical surfaces 316 of the one or more vertical fins as layer 317 is reacted with HF and $NH_3$ and on horizontal surface 314 of insulator 304, as layer 304 is simultaneously reacted with HF and $NH_3$, the by-product builds up to form base structure 318, as made from the remaining unreacted oxide. This build up is a consequence of the volume expansion of the reaction product layer relative to the volume of reacted oxide. For example, in the case of the reaction identified and discussed above, the reaction by-product undergoes a volume expansion of about a factor of 3 relative to the volume of reacted oxide. Hence, the layer of products of the self limiting reaction serves as the reaction limiter with a layer of thickness by temperature and/or pressure.

Figure 4:
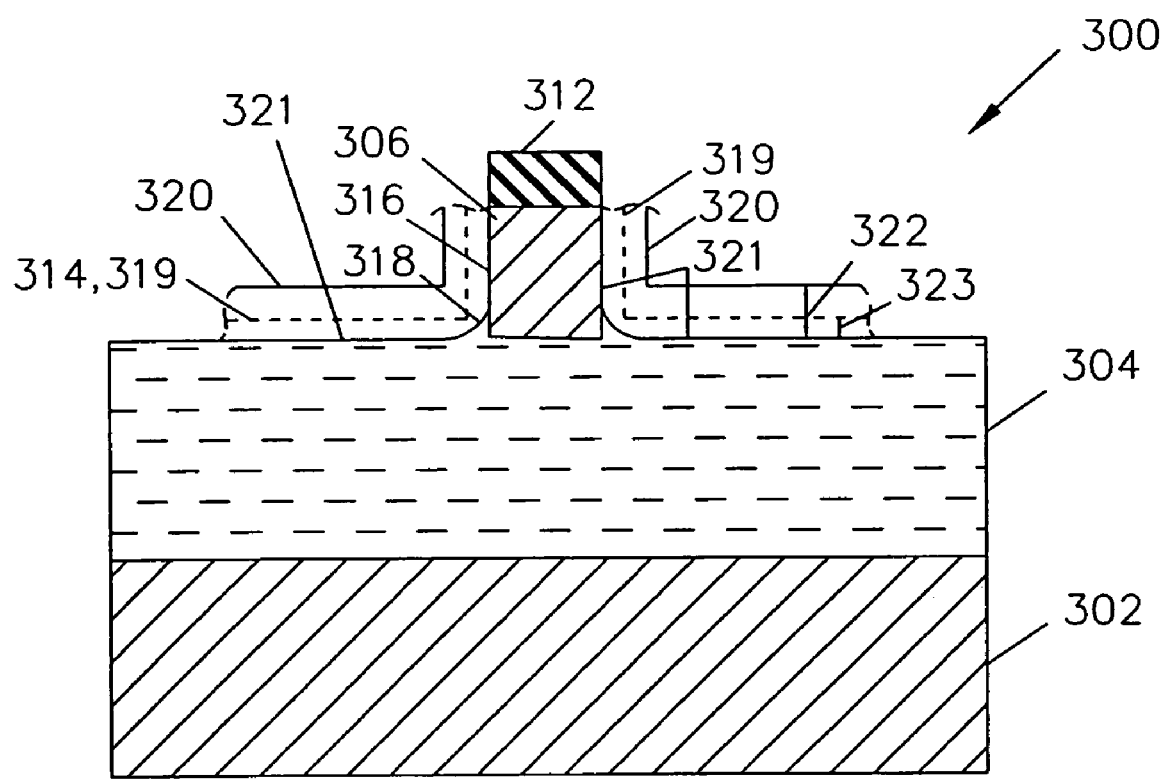
FIG. 4 is a cross-sectional side view of a FinFET during a fabrication method in accordance with an exemplary embodiment of the present invention.

Referring to FIG. 4, a vertical surface of the product layer after reaction 320 and a horizontal surface of the structure after reaction 321 are shown. Dotted line 319 denotes the location of the oxide surface prior to reaction with a gaseous mixture of HF and NH3. Surfaces 320 and 321 are preferably terminated near cap material 312. However, this need not be the case, as surfaces 320 and 321 may or may not extend over cap material 312. For example, if cap material 312 is oxide, and the self-limiting reaction is the HF and NH3 reaction described above, then the reaction will occur with the cap material 312 and the layer of reaction products and the surface thereof will extend over cap material 312 as well.

It is noted that the reactivity or lack of reactivity of cap material 312 has no impact on the present invention. Also, distance 322, from surface 320 to surface 321 is approximately about 3 times distance 323. Distance 322 denotes the self-limiting thickness of the reaction product layer. Distance 323 is the distance from original oxide surface 319 to surface 321 after reaction. The factor of about 3 difference in thicknesses of distances 322 and 323 is due to the volume expansion upon reaction which was noted above.

It is also noted that less etching has occurred in a corner region near the base of the vertical fin where a sloped region 318 is preferably formed. In this sloped region 318, the reaction products from the generally vertical and from the generally horizontal surfaces of the corner region merge and add together, thus forming a layer with the required thickness for self-limiting after less total etching than is needed on reacting surfaces away from the corner. While, away from the corner, the reaction product layer is able to expand away from the reacting oxide surface without interference and without adding to and merging with reaction product from any other surface. A curved surface in the remaining, unreacted, oxide is preferably formed into sloping base structure in region 318 because of the reduced etching.

Thus, the undercut of fin 306, as shown in FIG. 1f of the prior art which can be caused by an aqueous HF etch, is preferably eliminated by the embodiment just described.

The gently sloping base structure 318 is suitable to enhance the integrity of each fin and/or inhibit or prevent any undercut damage. It is noted that use of the HF and ammonia reaction for a portion of step 208 may preclude use of an aqueous HF etch for a portion of step 206.

Having identified and discussed some of the preferred embodiments of the present invention, it should be understood that the foregoing description is only illustrative of the present invention. Various alternatives, modifications and variations can be devised by those skilled in the art without departing from the present invention. Accordingly, the present invention is intended to embrace all such alternatives, modifications and variances.

What is claimed is:

1. A method of forming a vertical fin on a substrate comprising the steps of:
   providing the substrate having one or more semiconductor layers and one or more insulators;
   forming one or more vertical fins from said one or more semiconductor layers; healing damage resulting from said step of forming said one or more vertical fins, said step of healing damage being accomplished by a sacrificial oxidation and a sacrificial oxide clean; and
   providing a sloped base structure to said one or more vertical fins, said step of providing a sloped base structure being accomplished using a self-limiting product reaction.

2. The method of claim 1, wherein said substrate has a first semiconductor layer that underlies a buried insulator that in turn underlies a second semiconductor layer.

3. The method of claim 1, wherein said substrate is a single crystal SOI wafer.

4. The method of claim 1, wherein said substrate is a non-SOI wafer.

5. The method of claim 1, further comprising the step of: providing a hard mask film on at least one of said one or more semiconductor layers.

6. The method of claim 5, wherein said hard mask film is a silicon dioxide or a silicon nitride.

7. The method of claim 5, further comprising the step of: providing a photoresist layer above said hard mask film.

8. The method of claim 7, further comprising the steps of:
patterning said hard mask film as desired; and
removing said photoresist layer and/or at least one of said one or more semiconductor layers by a suitable chemical process.

9. The method of claim 1, wherein said sloped base structure is integral to both said one or more vertical fins and said one or more insulators.

10. The method of claim 9, wherein said sloped base structure is suitable to prevent any undercutting of said one or more vertical fins.

11. A method of forming a FinFET from a substrate comprising the steps of:
providing the substrate having one or more semiconductor layers and one or more insulators;
forming one or more vertical fins from said one or more semiconductor layers;
forming a sacrificial oxide layer;
performing a pre-gate oxide clean to at least substantially remove said sacrificial oxide layer from the substrate; and
providing an outwardly sloped base to said one or more vertical fins via a self-limiting reaction.

12. The method of claim 11, wherein said self-limiting reaction includes HF and ammonia.

13. The method of claim 11, wherein said self-limiting reaction includes HF and ammonia in combination with aqueous HF.

14. The method of claim 11, wherein said self-limiting reaction results in a reaction product layer that expands in volume, wherein said reaction product layer limits the reaction at a base of said one or more vertical fins.

15. The method of claim 11, wherein said pre-gate oxide cleaning step comprises a thermal oxidation along with a non-damaging oxide etch.

* * * * *